US006618649B1

(12) United States Patent
Shilo

(10) Patent No.: US 6,618,649 B1
(45) Date of Patent: Sep. 9, 2003

(54) METHODS AND APPARATUS FOR CHARACTERIZING A CIRCUIT BREAKER DEVICE

(75) Inventor: Marcel Shilo, Framingham, MA (US)

(73) Assignee: EMC Corporation, Hopkinton, MA (US)

(*) Notice: Subject to any disclaimer, the term of this patent is extended or adjusted under 35 U.S.C. 154(b) by 0 days.

(21) Appl. No.: 09/670,429

(22) Filed: Sep. 26, 2000

(51) Int. Cl.[7] .......................... G05B 11/01; G06F 19/00
(52) U.S. Cl. .................... 700/292; 700/78; 700/177; 702/115
(58) Field of Search ................. 700/21, 22, 79, 700/81, 177, 292, 293; 702/115; 324/424

(56) References Cited

U.S. PATENT DOCUMENTS

| 4,530,024 A | * | 7/1985 | Brady, Jr. ................. 361/63 |
| 4,814,712 A | * | 3/1989 | Burton et al. ............ 324/424 |
| 5,373,411 A | * | 12/1994 | Grass et al. ............. 361/115 |
| 5,459,630 A | * | 10/1995 | MacKenzie et al. ...... 324/520 |
| 5,475,609 A | * | 12/1995 | Apothaker .............. 700/292 |
| 5,617,078 A | * | 4/1997 | Durif et al. ............. 340/649 |
| 5,734,576 A | * | 3/1998 | Klancher ............... 324/424 |
| 5,736,861 A | * | 4/1998 | Keleher et al. .......... 324/424 |
| 5,796,636 A | * | 8/1998 | Andrews ................ 361/93.2 |
| 5,813,110 A | * | 9/1998 | Arntson et al. ......... 29/243.53 |
| 5,821,876 A | * | 10/1998 | Farrington et al. ...... 307/132 E |
| 5,982,593 A | * | 11/1999 | Kimblin et al. .......... 324/424 |
| 6,429,659 B1 | * | 8/2002 | Marple et al. ........... 324/415 |

* cited by examiner

Primary Examiner—Leo Picard
Assistant Examiner—Elliot Frank
(74) Attorney, Agent, or Firm—Chapin & Huang, L.L.C.; David E. Huang, Esq.

(57) ABSTRACT

Techniques characterize a circuit breaker device utilizing an apparatus having an energy storage device for storing and releasing a particular amount of energy and a controller. The controller (i) disconnects the energy storage device from an interface and connects the energy storage device to an external power source to store the particular amount of energy in the energy storage device, and (ii) disconnects the energy storage device from the external power source and connects the energy storage device to the interface such that energy is released from the energy storage device through the interface and through the circuit breaker device. The circuit breaker device is deemed to belong to a first category when the circuit breaker device trips in response to the released energy, and a second category when the circuit breaker device does not trip in response to the released energy.

34 Claims, 7 Drawing Sheets

METHODS AND APPARATUS FOR CHARACTERIZING A CIRCUIT BREAKER DEVICE

BACKGROUND OF THE INVENTION

Circuit breakers are often used to protect wiring that carries current over external power lines (i.e., from a power source) to computer systems (i.e., loads). Such circuit breakers are effective in preventing thermal events (e.g., smoke and fire) from going beyond control. A typical circuit breaker includes a connection mechanism that can be placed in one of three positions: an off position, a set position, and a tripped position.

Suppose that such a circuit breaker is installed between external power lines and wiring that leads to a computer system. When the connection mechanism of the circuit breaker is in the off position, the circuit breaker does not allow current to flow between the external power lines and the wiring leading to the computer system. When the connection mechanism is in the set position, the circuit breaker allows current below a rated trip threshold to flow through the circuit breaker between the external power lines and the wiring. If the current flowing through the circuit breaker exceeds the rated threshold, the connection mechanism of the circuit breaker "trips", i.e., transitions from the set position to the tripped position. Once the connection mechanism of the circuit breaker transitions to the tripped position, the connection mechanism does not allow further current to flow between the external power lines and the wiring leading to the computer system in order to protect the wiring from the effects of excessive current.

In addition to the above-described conventional circuit breaker which installs between external power lines and wiring leading to a computer system (hereinafter referred to as an external circuit breaker), some computer systems include one or more circuit breakers (hereinafter referred to as internal circuit breakers) that protect circuitry within the computer systems against damage from over-current fault conditions. In general, the connection mechanism of an internal circuit breaker operates in a manner similar to that of an external circuit breaker. For example, suppose that an internal circuit breaker is installed within a computer system between a computerized device within the computer system and external wiring that leads to external power lines (perhaps through an external circuit breaker). When the connection mechanism of the internal circuit breaker is in the off position, the internal circuit breaker does not allow current to flow through it to reach the computerized device. When the connection mechanism of the internal circuit breaker is in the set position, the internal circuit breaker allows current below a rated threshold to flow through it and between the wiring leading to the external power lines and the computerized device. However, if the current flowing through the internal circuit breaker exceeds the rated threshold, the connection mechanism of the internal circuit breaker "trips", thus moving the connection mechanism of the circuit breaker to a tripped position. Once the connection mechanism transitions to the tripped position, the connection mechanism does not allow further current to flow through it between the wiring leading to the external power lines and the computerized device thus protecting the computerized device from excessive current.

In general, the threshold of the external circuit breaker is designed to be higher than the threshold of the internal circuit breaker protecting the computerized device of the computer system since the wiring (and other external power equipment) leading to the computer system is typically designed to carry at least as much current as that which flows through circuitry within the computer system. For example, in Europe, the external circuit breaker for a computer system can have a threshold of 32 amperes, and the internal circuit breaker for the computer system can have a threshold of 30 amperes.

Some computer system installations use multiple external circuit breakers and multiple internal circuit breakers. In one configuration, the external multi-phase power equipment that protects the wiring leading from power supply lines to such a computer system includes a multi-pole or "ganged" multi-phase circuit breaker. The connection mechanisms for the poles (the outputs or current paths provided by the circuit breaker) share common trip linkage forcing all of the connection mechanisms to reside in the same position at the same time. For example, suppose that all connection mechanisms are in the set position. If current flowing from one of the poles exceeds the threshold for the circuit breaker, the connection mechanism for that pole transitions from a set position to a tripped position preventing further current from flowing from that pole. At the same time, the trip linkage forces the connection mechanisms for the remaining poles to automatically transition from their set positions to their tripped positions. Accordingly, when one pole of the ganged circuit breaker trips, all of the poles of the ganged circuit breaker trip thus preventing any current from flowing through the ganged circuit breaker.

In contrast to the ganged external circuit breakers of the external power equipment for the computer system, multiple internal circuit breakers for the computer system are typically un-ganged. That is, the internal circuit breakers are not mechanically coupled together. Accordingly, if one internal circuit breaker trips, the other internal circuit breakers do not automatically trip. As a result, computer systems can be designed with fault tolerant power features (e.g., multiple power units) which enable the computer systems to remain powered up and operational even when one of multiple internal circuit breakers trip (e.g., when one of three internal circuit breakers that respectively protect three power units trips leaving two internal circuit breakers and two power units operational).

The above-described external and internal circuit breakers typically carry alternating current (AC). In contrast, some circuit breaker suppliers market circuit breakers designed to carry direct current (DC). In either case, circuit breaker suppliers typically rate their circuit breakers with a threshold (e.g., 1 5-amp, 30-amp, 50-amp, etc.) and a trip coil tolerance (e.g., +/−35%). Prior to releasing their circuit breakers into the stream of commerce, the suppliers can test their circuit breakers to confirm that their circuit breakers conform to their rated specifications.

In one testing approach, the supplier installs a circuit breaker in a test assembly, and places the connection mechanism of that circuit breaker into the set position. The supplier then verifies that the circuit breaker properly allows current to pass through it by providing, through the circuit breaker, a test current (e.g., from a signal generator, a transformer, etc.) that is lower than a rated threshold for that circuit breaker (e.g., 30 amperes). If the supplier is testing an AC circuit breaker, the supplier provides alternating current; if the supplier is testing a DC circuit breaker, the supplier provides direct current. Next, the supplier attempts to increase the current (e.g., incrementally) until the current exceeds the rated threshold. If the circuit breaker operates properly, the connection mechanism of the circuit breaker trips when the magnitude of the current is within a specified tolerance of the rated threshold (e.g., +/−35%), thus preventing further current from passing through the circuit breaker. If the circuit breaker does not trip within this tolerance (or if the circuit breaker tripped prematurely before the current exceeded the threshold), the supplier typically considers the circuit breaker defective and does not ship that circuit breaker. Suppliers can increase the sophistication of the tests by varying the time delays between incremental current increases and measuring time delays before the circuit breaker trips. Such data can then be plotted to provide performance curves describing the expected performance under different current conditions.

In situations in which computer system manufacturers use off-the-shelf circuit breakers from a supplier, the manufacturers generally build their computer systems with the off-the-shelf circuit breakers without testing the circuit breakers. That is, once the circuit breakers leave the supplier, the circuit breakers are not fault tested during the computer system assembly process nor during customer installation/integration in the field. Typically, once the circuit breaker leaves the supplier, the first test of the circuit breaker is during an undesired incident such as an over-current fault condition by a power unit in the computer system. If the circuit breaker is defective, the circuit breaker does not trip or trips prematurely. Both events are undesirable particularly since manufacturers typically do not provide circuit breaker redundancy as a fault tolerant feature. The above-described situation is typical even for expensive circuit breakers which provide for electromechanical alignment before sealing and packaging the finished goods assembly.

SUMMARY OF THE INVENTION

In some situations the internal circuit breakers of some computer systems may inadvertently have thresholds that exceed the thresholds of the external circuit breakers which protect wiring that carries current between power supply lines and the computer system. For example, suppose that external power equipment at a computer system installation includes a three-pole, 32-amp, ganged external circuit breaker for protecting wiring that leads to a particular computer system (32-amps is a standard threshold for a class of external circuit breakers in Europe). A different alternating current power signal flows through each of the three poles of the circuit breaker (each power signal generally being 120 degrees out of phase with the other two power signals). Further suppose, by way of example only, that the computer system includes three internal 30-amp circuit breakers that lead to respective power units of the computer system (i.e., respective AC/DC converters, power supplies, etc.). Based on these specifications, the actual threshold of the external circuit breaker (32-amps) should be higher than the actual threshold of each internal circuit breaker (30-amps). Accordingly, in the event of an over-current fault problem in one of the power units of the computer system, one would expect the internal circuit breaker for that power unit to trip preventing further current from flowing through that power unit. If the computer system is designed to remain powered up and running upon the occurrence of such an event, the other internal circuit breakers and the external circuit breakers will not trip thus allowing the remaining power units and the computer system to continue operating.

It is possible, however, that the external ganged circuit breaker has a lower actual threshold than the internal circuit breakers. For example, suppose that both the external, ganged, 32-amp circuit breaker and the internal 30-amp circuit breakers are guaranteed to trip at 125% of their rated value +/−10% due to extraneous factors such as environmental conditions (temperature, etc.). Further suppose that a situation arises in which the external 32-amp circuit breaker operates at its worst case (e.g., due to a location in a poor environment) but the internal 30-amp circuit breaker operates under nominal conditions (e.g., due to a location in a proper environment).

In the above-described situation the external circuit breaker trips at t 115% of its rated value (i.e., at 125% less 10% due to the poor environmental conditions). Accordingly, the external 32-amp circuit breaker has an actual threshold of 36.8 amperes (115% of 32 amperes). Furthermore, the internal 30-amp circuit breaker trips at 125% since there are no detrimental environmental conditions that affect the circuit breaker's operation. Accordingly, the internal 30-amp circuit breaker has an actual threshold of 37.5 amperes (125% of 30 amperes). Since, in this situation, the actual threshold of the internal circuit breaker is 37.5 amperes and the actual threshold of the external circuit breaker is 36.8 amperes, and all other variables being equal, the external circuit breaker will trip first rather than the internal circuit breaker in response to an over-current fault condition. It should be understood that 100% to 125% is a "band" of uncertainty where circuit breaker tripping is not guaranteed by the supplier (i.e., the manufacturer of the circuit breaker component). This band may be of no practical use for stiff current (catastrophic) faults (i.e., when the magnitude of the current is at least 10 times higher over nominal).

Tripping of the external circuit breaker deprives the entire computer system of current since the external circuit breakers are ganged together through a common trip linkage. Accordingly, such a trip causes the computer system to perform a fail safe shutdown procedure or worse (e.g., a crash) rather than remain operational (even if the computer system is equipped with redundant power units for fault tolerance). A crash of a computer system is generally perceived as a catastrophic failure since the computer system can sustain damage when abruptly powered down in an uncontrolled state. For example, data stored in volatile memory (e.g., semiconductor memory) that is unsynchronized with non-volatile memory (e.g., disk memory) will be lost. Additionally, disk memory can become corrupt (e.g., due to inadvertent contact between a disk head and a magnetic disk of a disk drive when power is lost). Furthermore, circuitry can be damaged (e.g., due to signals passing through particular circuits in an uncontrolled manner, while the circuitry is in an undetermined state, etc.).

The invention is directed to techniques for characterizing a circuit breaker device (or electromagnetic mechanical interrupting device) that protects against extreme electrical stresses (e.g., over-current fault conditions, thermal events, etc.). Such characterization enables self-testing of circuit breakers. Manufacturers can then build computer systems with more assurance that an internal circuit breaker will trip rather than an external circuit breaker in response to an over-current fault condition within the computer system. Accordingly, computer systems equipped to continue operating even when one power unit is lost (e.g., fault tolerant computer systems with multiple power units protected by respective internal circuit breakers) can avoid catastrophic failures (e.g., a computer system crash).

Furthermore, such circuit breaker characterization enables suppliers and manufacturers to group circuit breaker devices so that all of the circuit breaker devices for particular computer system have similar actual thresholds. Such use of similar actual thresholds reduces service and repair time and costs. For example, if a technician has no knowledge of whether internal circuit breakers have similar thresholds, the technician may be unsure whether a reoccurring trip of an internal circuit breaker is due to an overly sensitive internal circuit breaker or a defective power unit, and thus may spend additional time and effort identifying and correcting the cause of the reoccurring trip. However, if the technician knows that the internal circuit breakers have similar thresholds (perhaps the technician can even use a self-test built into the internal circuit breakers), the technician may be able to easily identify the true cause of the reoccurring trip (e.g., swapping power units and seeing whether the same circuit breaker trips) thus saving time and effort.

One arrangement of the invention is directed to an apparatus for characterizing a circuit breaker device. The apparatus includes an interface that is capable of connecting to the circuit breaker device, an energy storage device that is capable of storing and releasing a particular amount of energy, and a controller that is coupled to the energy storage device and the interface. The controller (i) disconnects the energy storage device from the interface and connects the energy storage device to an external power source to store the particular amount of energy in the energy storage device, and (ii) disconnects the energy storage device from the external power source and connects the energy storage device to the interface such that, when the circuit breaker device is connected to the interface, energy is released from the energy storage device through the interface and through the circuit breaker device. The circuit breaker device is deemed as belonging to a first category when the circuit breaker device trips in response to the released energy, and deemed as belonging to a second category when the circuit breaker device does not trip in response to the released energy.

The above-described arrangement provides a simple technique for screen matching circuit breaker devices according to their actual thresholds (i.e., using the characterization apparatus to characterize multiple circuit breaker devices such as in groups of 2, 3, 4, etc. per application). Accordingly, such screening enables computer system manufacturers to build computer systems having matched circuit breakers for equal loads.

In one arrangement, the apparatus is integrated in a computer system having a computerized device for performing computerized operations, and a circuit breaker device that protects the computerized device against an extreme electrical stress. This arrangement enables the circuit breaker devices of the computer system to be tested at will (e.g., periodically) to check that the circuit breaker devices operate at actual thresholds that would enable the circuit breaker devices to trip in response to an over-current fault conditions within the computer system thus avoiding tripping of any external circuit breakers protecting wiring that leads to the computer system. If the computer system includes redundancy (e.g., multiple circuit breaker devices and multiple power units), the computer system may remain operational even though an internal circuit breaker device has tripped.

In one arrangement, the energy storage device of the characterization apparatus is configured to provide direct current through the circuit breaker device when the controller of the characterization apparatus connects the energy storage device to the interface of the characterization apparatus (e.g., by discharging a charged capacitor device).

In one arrangement, the energy storage device of the characterization apparatus includes a capacitor bank for storing energy from the external power supply and releasing energy through the circuit breaker device. The capacitor bank provides a simple technique for delivering a consistent amount of energy during each use of the characterization apparatus. The energy stored and released by the capacitor bank is based on the capacitance and voltage of the capacitor bank. In particular, the same amount of energy can be stored and released by decreasing the capacitance and increasing the voltage (i.e., decreasing the capacitance by a factor of four, and doubling the voltage). Such a tradeoff between capacitance and voltage enables a user of the characterization apparatus to easily scale the capacitor bank capacity.

In one arrangement, the energy storage device of the characterization apparatus further includes a calibration device for adjusting storage capacity of the capacitor bank (e.g., by varying the voltage or capacitance of the energy storage device). Accordingly, the amount of energy that the energy storage device stores and releases is adjustable. As such, the amount of energy stored and released by the capacitor can be precisely controlled for use in characterizing circuit breaker devices having different specified thresholds.

In one arrangement, the controller of the characterization apparatus includes a manually operated switch. When the switch is manually placed in a first position, the switch disconnects the energy storage device from the interface and connects the energy storage device to the external power source. When the switch is manually placed in a second position, the switch disconnects the energy storage device from the external power source and connects the energy storage device to the interface. When the switch is manually placed in a third position, the switch disconnects the energy storage device from both the interface and the external power source. Accordingly, the switch enables an operator (e.g., a technician) to manually control operation of the characterization apparatus. In particular, placement of the switch in the third.position isolates the energy storage device from the external power source and the interface thus enabling a technician to access and service components of the characterization apparatus (e.g., hot swap a component while the computer system remains powered up and operational).

In another arrangement, the controller of the characterization apparatus includes a switch that (i) disconnects the energy storage device from the interface and connects the energy storage device to the external power source in response to a first signal, (ii) disconnects the energy storage device from the external power source and connects the energy storage device to the interface in response to a second signal, and (iii) disconnects the energy storage device from both the interface and the external power source in response to a third signal. This arrangement enables an operator to control the operation of the characterization apparatus using software in an automated manner (e.g., periodically). For example, the first, second and third signals can be commands provided to the controller of the characterization apparatus from the computerized device. As another example, the signals can be commands provided by a separate computer (e.g., a portable laptop, a remote computer through a network or telephone line connection, etc.). In particular, the third signal can be provided to isolate the energy storage device from other parts of the computer system for online repair (i.e., access and/or replacement of components while computer system remains powered up and operational).

In other arrangements the characterization apparatus is separate from the computer system. For example, the apparatus can be used by the supplier to screen or categorize multiple circuit breaker devices on an assembly line. Alternatively, the apparatus can be used by a manufacturer (e.g., an OEM) to screen or categorize circuit breaker device stock from a supplier prior to installation of the circuit breaker stock into computer systems or computerized devices. In these various arrangements, the apparatus can be used to select circuit breaker devices with similar actual thresholds to form screened groups or sets of circuit breaker devices, and to enable use of circuit breaker devices with actual thresholds that are below the thresholds of external circuit breakers to ensure that the circuit breaker devices trip in response to internal over-current fault conditions rather than the external circuit breakers.

The features of the invention, as described above, may be employed in computer systems, methods and manufacturing procedures as well as other computer-related components such as those manufactured by EMC Corporation of Hopkinton, Mass.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION

The invention is directed to techniques for characterizing a circuit breaker device that protects against extreme electrical stresses (e.g., over-current fault conditions leading to thermal events, etc.). Such characterization enables screening and/or testing of circuit breakers (i.e., labeling circuit breakers into matched sets based on their actual thresholds). Manufacturers can then build computer systems with more assurance that an internal circuit breaker will trip rather than an external circuit breaker in response to an over-current fault condition within the computer system. Accordingly, computer systems equipped to continue operating even when a power unit is lost (e.g., fault tolerant computer systems with multiple power units protected by respective internal circuit breakers) can avoid catastrophic failures (e.g., a computer system crash). The techniques of the invention may be used in computer systems, manufacturing procedures, and with other computer-related devices such as those manufactured by EMC Corporation of Hopkinton, Mass.

Figure 1:
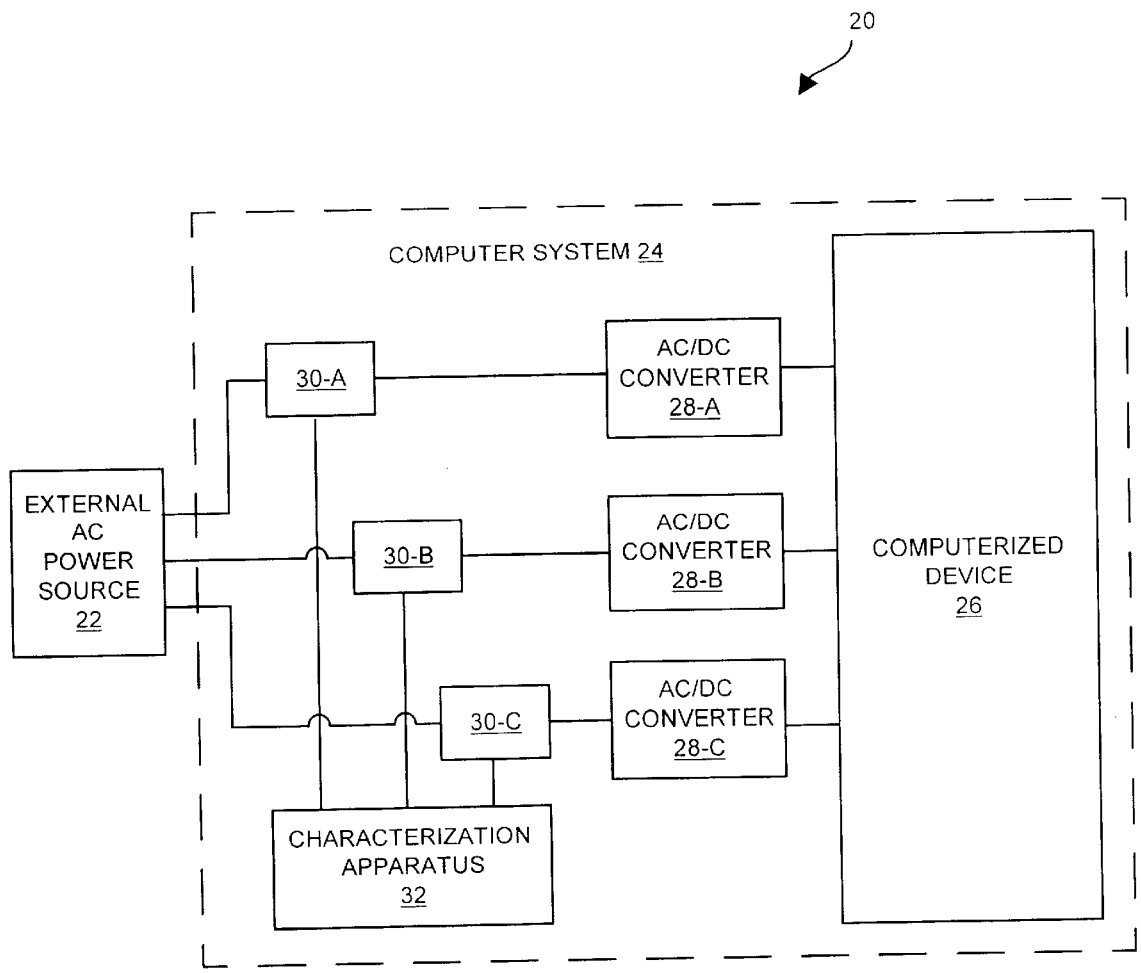
FIG. 1 is a block diagram of a computer system installation which is suitable for use by the invention.

FIG. 1 shows a computer system installation 20 which is suitable for use by the invention. The computer system installation 20 includes an external AC power source 22 and a computer system 24. The computer system 24 includes a computerized device 26, AC/DC converters 28-A, 28-B and 28-C (collectively, AC/DC converters 28), internal circuit breaker devices 30-A, 30-B and 30-C (collectively, internal circuit breaker devices 30) and a characterization apparatus 32. The internal circuit breaker devices 30 are separate, un-ganged devices such that tripping of one internal circuit breaker device 30 does not automatically cause the remaining internal circuit breaker devices 30 to trip.

The computer system 24 includes a fault tolerant feature that enables the computerized device 26 to remain powered up and operational in the event that one of the AC/DC converters 28 becomes unavailable. For example, if a problem in the AC/DC converter 28-A causes the AC/DC converter 28-A to draw an amount of current that exceeds the actual threshold of the internal circuit breaker device 30-A (an over-current fault condition), the corresponding internal circuit breaker device 30-A will trip. However, the remaining circuit breaker devices 30-B and 30-C will remain in their on positions. Accordingly, the circuit breaker device 30-A will safely handle the over-current fault condition by inactivating only the problematic AC/DC converter 28-A. The AC/DC converters 28-B and 28-C will remain operational. As such, the computerized device 26 will remain powered-up and running. That is, the number of redundant components (i.e., the AC/DC converters 28), drops from N+1 to N, and the computerized device 26 continues operation (i.e., the remaining AC/DC converters 28-B and 28-C ensure that the computerized device 26 is not starved for power).

The characterization apparatus 32 enables characterization of the internal circuit breaker devices 30 into different categories by releasing a controlled amount of energy from the characterization apparatus 32 through each of the internal circuit breaker devices 30. The released energy signal has a steep leading edge in order to trigger the internal circuit breaker devices 30 if they have suitable actual thresholds. In one arrangement, the triggering effect is lost if the signal has a slow transition (i.e., does not have a steep leading edge).

In general, a technician considers an internal circuit breaker device 30 as belonging to a first category (e.g., suitable) when that internal circuit breaker device 30 trips in response to the released energy, and as belonging to a second category (e.g., unsuitable) when that internal circuit breaker device 30 does not trip in response to the released energy. Further details of the computer system installation 20 will now be provided with reference to FIG. 2.

Figure 2:
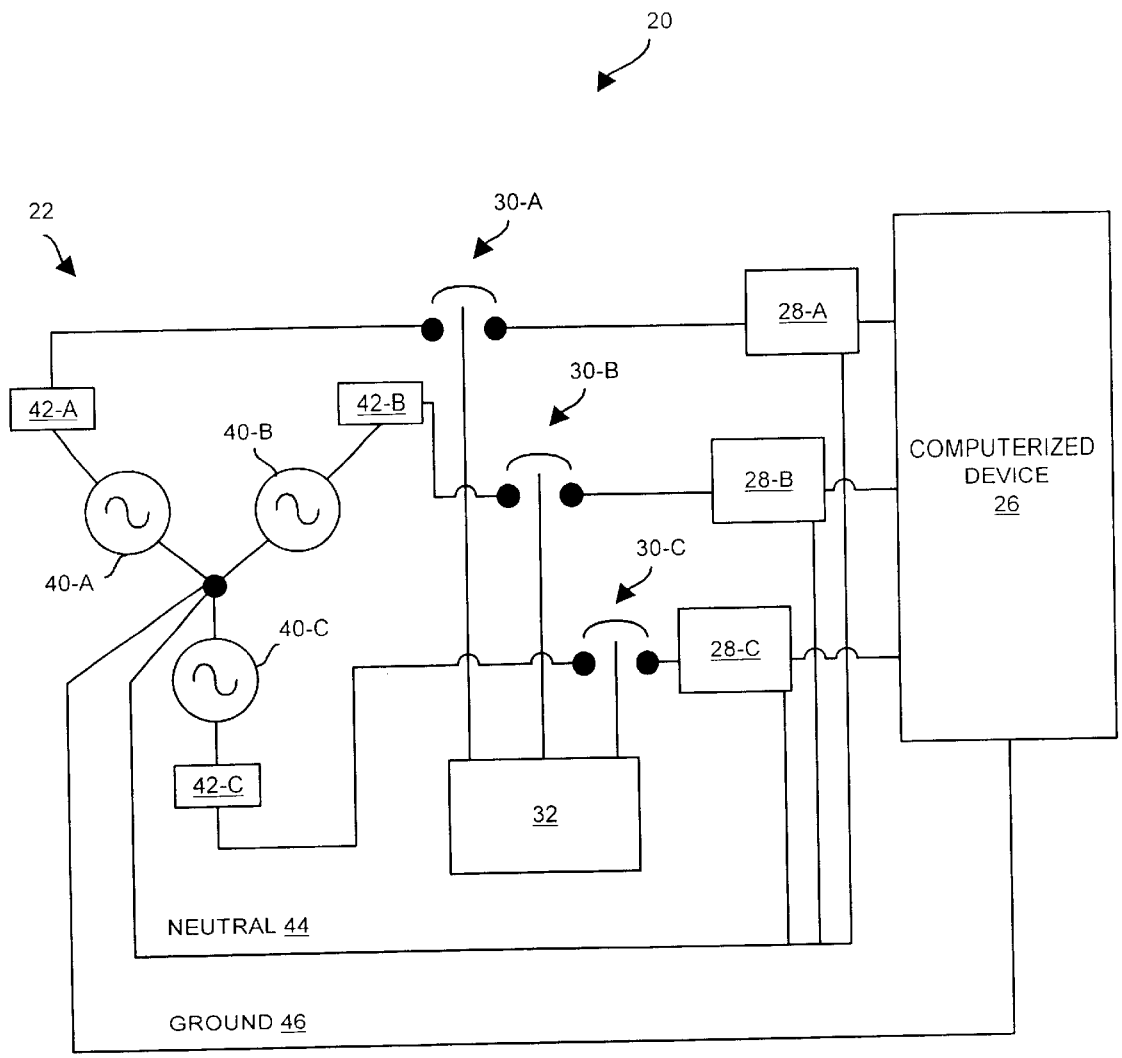
FIG. 2 is an electrical diagram of the computer system installation of FIG. 1.

FIG. 2 shows an electrical diagram of the computer system installation 20 of FIG. 1. The external AC power source 22 includes multiple AC power lines 40-A, 40-B and 40-C (hereinafter, referred to as power lines 40) represented symbolically as AC sources providing separate power signals (e.g., differing in phase from each other by 120 degrees). The external AC power source 22 further includes corresponding external circuit breakers 42-A, 42-B and 42-C (hereinafter, referred to as external circuit breaker devices 42), a neutral line 44 and a ground line 46. The external circuit breakers 42 are ganged together using a common linkage (i.e., the external circuit breakers 42 form individual, mechanically-connected poles of a single larger external circuit breaker) such that, when one external circuit breaker 42 trips, all of the external circuit breakers 42 trip. The power lines 40 and external circuit breakers 42 are preferably accessible in a power equipment cabinet (e.g., an electrical service panel) or power distribution unit (PDU) panel.

Also, as shown in FIG. 2, each of the AC/DC converters 28 of the computer system 20 connects with the neutral line 44. Additionally, the computerized device 26 connects with the ground line 46.

The actual thresholds of the internal circuit breaker devices 30 are lower than the actual thresholds of the external circuit breakers 42 such that an over-current fault condition within one of the AC/DC converters 28 of the computer system 24 causes a corresponding internal circuit breaker device 30 to trip rather than all of the external circuit breakers 42 to trip. Upon the occurrence of such an event, the other internal circuit breaker devices 30 (as well as the external circuit breakers 42) remain in their on positions. Accordingly, the other AC/DC converters 28 remain operational and the computerized device 26 remains in operation.

The characterization apparatus 32 enables characterization of the circuit breaker devices 30 at will to verify that the thresholds of the internal circuit breaker devices 30 have not changed (e.g., due to premature aging, a defect, damage, etc.). Such characterization of the circuit breaker devices can occur during scheduled maintenance periods for the computer system 24 for convenience. Further details of the characterization apparatus 32 will now be provided with reference to FIG. 3.

Figure 3:
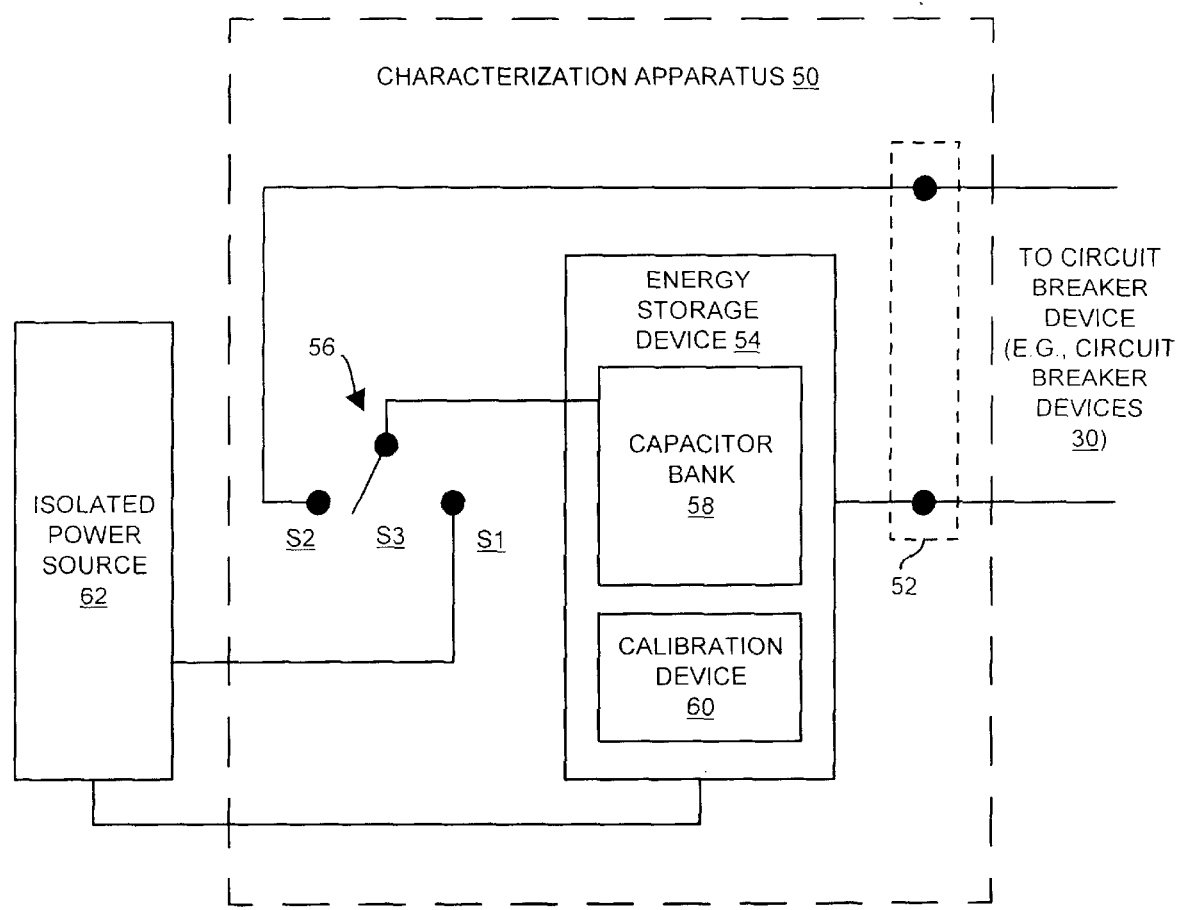
FIG. 3 is a block diagram of a characterization apparatus which is suitable for use in a computer system of the computer system installation of FIG. 1.

FIG. 3 is a block diagram of a characterization apparatus 50 which is suitable for use as the characterization device 32 of the computer system 24. The characterization apparatus 50 is also suitable for use as a standalone device (e.g., for use by a circuit breaker device supplier or computer system manufacturer). The characterization apparatus 50 includes an interface 52, an energy storage device 54 and a controller 56. The energy storage device 54 includes a capacitor bank 58 and a calibration device 60. The characterization apparatus 50 stores energy from an isolated power source 62 (e.g., an external power source), and releases the energy to a circuit breaker device (e.g., an internal circuit breaker device 30) in order to characterize that circuit breaker device.

The interface 52 is a pair of contacts that connect to a circuit breaker device. The controller 56 controls the storage of energy within the energy storage device 54, and release of that energy through the circuit breaker device connected to the interface 52. In one arrangement, the controller 56 includes a switch having multiple positions. When the switch is in a position S1, the switch disconnects the capacitor bank 58 from the interface 52 and connects the capacitor bank 58 to the isolated power source 62 causing the energy storage device 54 to store energy from the isolated power source 62. When the switch is in a position S2, the switch disconnects the capacitor bank 58 from the isolated power source 62 and connects the capacitor bank 58 to the interface 52 causing the energy storage device 54 to release the energy through the circuit breaker connected to the interface 52. When the switch is in a position S3, the switch disconnects the capacitor bank 58 from both the isolated power source 62 and the interface 52 thus isolating the capacitor bank 58 from the isolated power source 62 and the interface 52. If the characterization apparatus 50 is integrated within a computer system (e.g., the computer system 24 of FIG. 1), a technician can access the energy storage device 54 of the characterization apparatus 50 without interfering with other parts of the computer system (e.g., the computerized device 26). Accordingly, the position S3 is well-suited for accessing the energy storage device 54 while the computer system remains power-up and in operation.

The calibration device 60 controls the amount of energy stored and released by the energy storage device 54. In particular, the calibration device 60 controls the capacitance (C) and/or voltage (V) that can be placed on the capacitor bank 58. Preferably, the capacitor bank 58 charges from a 100% fully-discharged state, and discharges over a finite time (t), counting from zero, to get the charge up to potential (V). The amount of energy dissipated into the circuit breaker device 30 under self-test in the switching event is proportional to the instantaneous current (I) times the voltage (V), integrated over the time of the switching event (or transient). Accordingly, an equation (1) for this amount of energy (E) can be determined as follows:

$$E_{stored} = E_{discharged} = \int_0^t V \cdot I\, dt = \int_0^t V \cdot C (dv/dt) dt$$

$$= \int_0^V C \cdot V\, dv = 1/2\, CV^2$$

Hence, $E(amount\ of\ energy) = \tfrac{1}{2}CV^2$ \hfill (1)

where: C is in units of [Farads]

V is in units of [Volts], and

E is in units of [Joules] or [Watt·Seconds].

As shown, the amount of energy is linearly proportional to the capacitance (C), i.e., the size of the capacitor bank 58, and quadratically proportional to the voltage (V).

In one arrangement, the calibration device 60 controls the capacitance (C) of the capacitor bank 58 (e.g., as a variable capacitor). In another arrangement, the calibration device 60 controls the voltage (V) that is applied across the capacitor bank 58 (e.g., using voltage dividing schemes). In yet another arrangement, the calibration device 60 provides control over both capacitance (C) and voltage (V).

It should be understood upon examining equation (1) that the energy storage device 54 can handle same amounts of energy by decreasing the capacitance (C) and increasing the voltage (V), or vice versa. Although it is preferably to work a lower voltage for safety reasons, it may be advantageous to lower the capacitance (C) and increase the voltage (V) in some situations. For example, there may be space limitations within a computer system. For such a computer system, the design engineer for the computer system can reduce the space for the energy storage device (capacitor bank) and compensate for the lost capacity by increasing the voltage. For instance, there is an equal tradeoff by lowering capacitance by a factor of four ($\Delta C$) and increasing the voltage by a factor of two ($\Delta V$).

Figure 4:
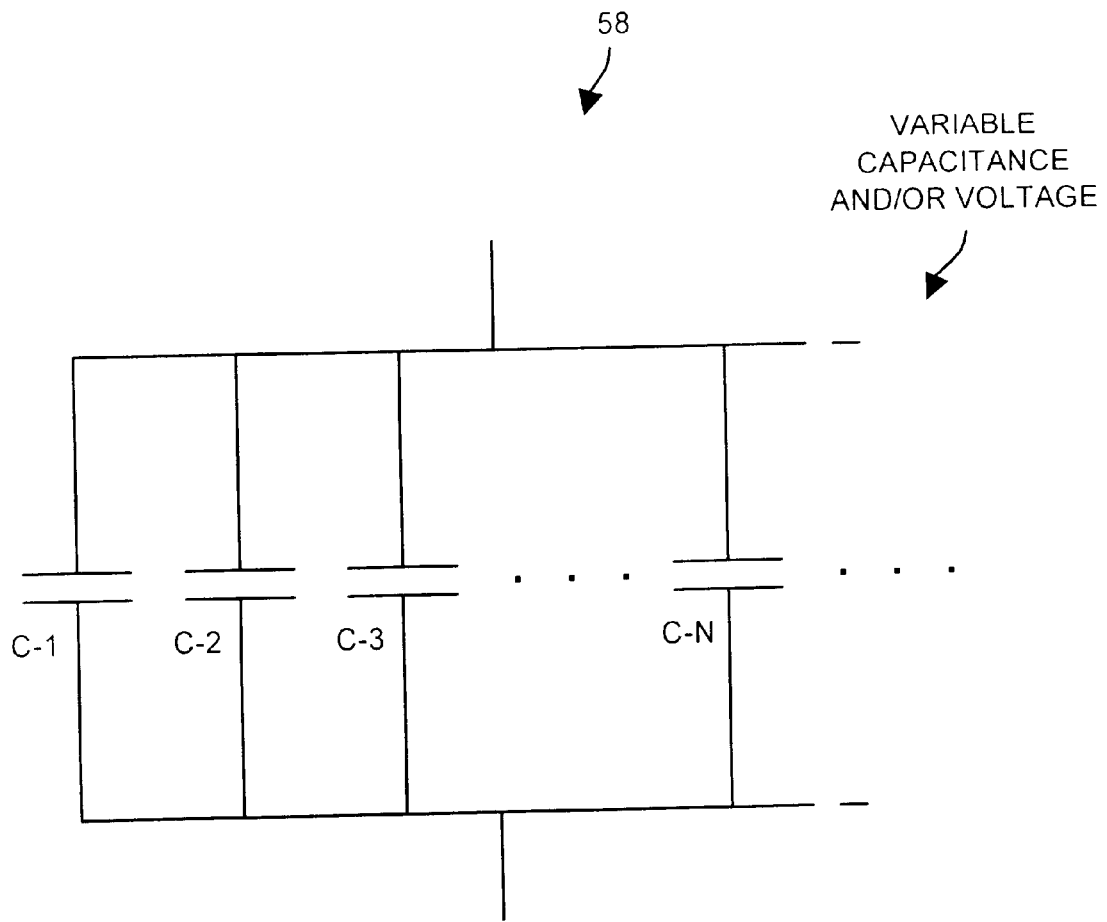
FIG. 4 is an electrical diagram of a capacitor bank of the characterization apparatus of FIG. 3.

FIG. 4 shows an arrangement of capacitors C-1, . . . , C-N or cells which are suitable for use in the capacitor bank 58. The capacitance of the capacitor bank 58 can be increased by adding cells, or decreased by removing cells. In one arrangement, the calibration device 60 controls (i.e., increases or decreases) the capacitance of the capacitor bank 58 by varying its size. In another arrangement, the calibration device 60 controls the applied voltage. Further details of how the characterization apparatus 50 operates will now be provided with reference to FIG. 5.

Figure 5:
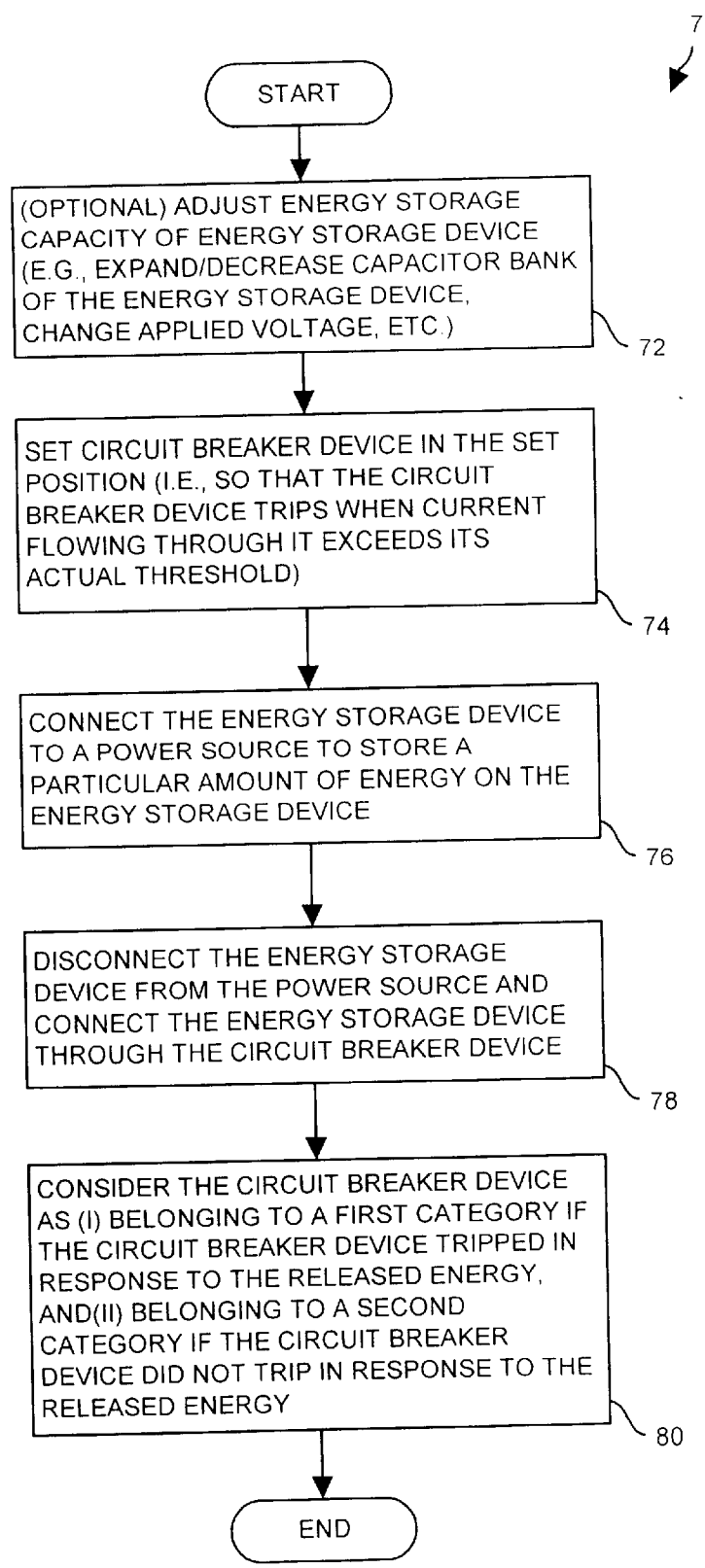
FIG. 5 is a flow diagram of a procedure performed by a technician when using the characterization apparatus of FIG. 3 to characterize a circuit breaker device.

FIG. 5 shows a procedure 70 which is performed by a technician to characterize a circuit breaker device using the characterization apparatus 50 of FIG. 3. In step 72, the technician adjusts the storage capacity of the energy storage device 54 so that the energy storage device 54 can release a suitable amount of energy through the circuit breaker device for characterization. Such an amount can be determined prior to testing from computed simulation, past experience or sample testing.

In step 74, the technician sets the circuit breaker device so that the circuit breaker device is in the on position. Accordingly, when the energy passing through the circuit breaker device exceeds the actual threshold of the circuit breaker device, the connection mechanism within the circuit breaker device will trip thus transitioning the circuit breaker device from the on position to the tripped position.

In step 76, the technician connects the energy storage device 54 to the isolated power source 62 to store a particular amount of energy on the energy storage device 54. In particular, the technician operates the controller 56 of the characterization apparatus 50 (e.g., places the switch 56 in position SI, see FIG. 3) to disconnect the capacitor bank 58 from the interface 52 and to connect the capacitor bank 58 to the isolated power source 62. Accordingly, the isolated power source 62 charges the capacitor bank 58 (i.e., stores energy in the energy storage device 54).

In step 78, the technician disconnects the energy storage device 54 from the isolated power source and connects the energy storage device 54 to the circuit breaker device. In particular, the technician operates the controller 56 (e.g., places the switch 56 in position S2) to disconnect the capacitor bank 58 from the isolated power source 62 and to connect the capacitor bank 58 to the interface 52. Accordingly, the capacitor bank 58 discharges through the interface 52 and the circuit breaker device (i.e., releases energy through the circuit breaker device). If the actual threshold of the circuit breaker device is lower than the released energy, the circuit breaker device trips in response to the released energy. However, if the actual threshold of the circuit breaker device is higher than the released energy, the circuit breaker device does not trip in response to the released energy.

In step 80, the technician places the circuit breaker device into a characterization category. In particular, if the circuit breaker device tripped in response to the released energy, the technician considers the circuit breaker device as belonging to a first category (e.g., "within specification"). If the circuit breaker device did not trip in response to the released energy, the technician considers the circuit breaker device as belonging to a second category (e.g., "outside of specification").

It should be understood that step 72 is optional, and need not be performed in order to characterize the circuit breaker device. Nevertheless, employing step 72 allows for precise control over the amount of energy stored and released by the energy storage device 54. Hence, the criteria (i.e., amount of energy passed through the circuit breaker device) for characterizing the circuit breaker device can be tightly controlled, and revised over time in response to accumulated experience or sample testing. Further details of how the characterization apparatus 50 works will now be provided with reference to FIG. 6.

It should be understood that a circuit breaker device does not reliably operate as expected under all electrical situations. For example, for some amounts of energy, a non-defective circuit breaker device would not trip. For other amounts of energy, the non-defective circuit breaker device will reliably trip. Furthermore, for yet other amounts of energy, the non-defective circuit breaker may or may not trip.

Figure 6:
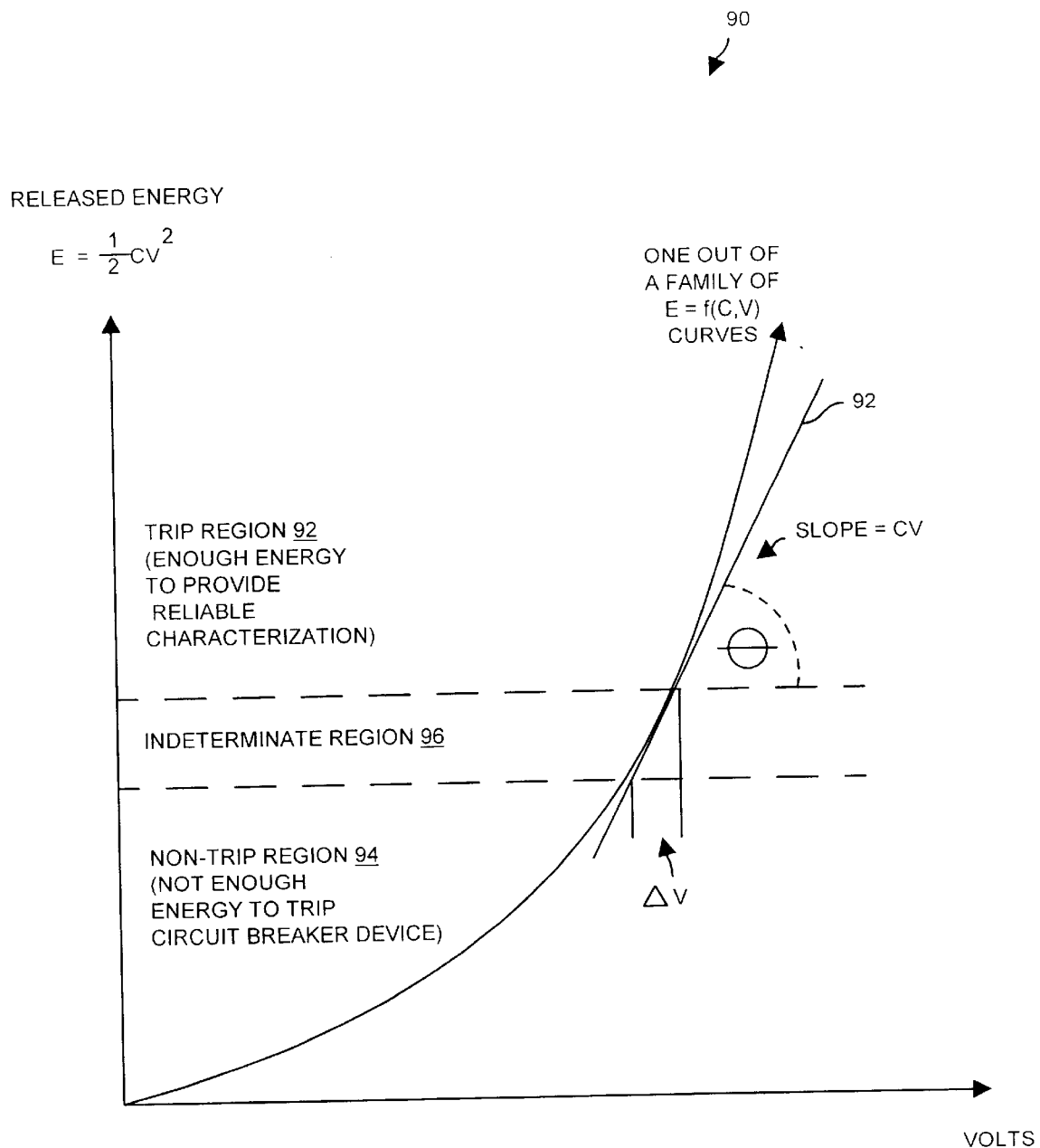
FIG. 6 is a graph illustrating different amounts of energy which can be stored and released by the characterization apparatus of FIG. 3.

FIG. 6 is a graph 90 illustrating different amounts of energy which can be stored and released by the characterization apparatus 50 and through a circuit breaker device. The characterization apparatus 50 should operate (i.e., store and release energy) in the trip region 92. In the trip region 92, the characterization apparatus 50 provides enough energy to reliably trigger the connection mechanism in the circuit breaker device (e.g., a magnetic circuit breaker). Precautions should be taken such that the characterization apparatus 50 (e.g., periodic calibration) does not operate in either the non-trip region 94 or the indeterminate region 96. In the non-trip region 94, the characterization apparatus 50 does not provide enough energy to reliably trigger the connection mechanism. In the indeterminate region 96, the characterization apparatus 50 may or may not provide enough energy.

Often, circuit breaker device suppliers provide specifications and graphs describing and illustrating regions similar to regions 92, 94 and 96 with the energy context removed thus making conventional circuit breaker specification verification testing outside of the component factory exceedingly laborious, i.e., nearly impractical. Hence, in conventional approaches, circuit breakers are purchased "on spec" and installed and used based on faith in the "spec". There is no practical self-test involved in the conventional approaches.

It should be understood from FIG. 6 that a particular capacitance (C) and voltage (V) used by the characterization apparatus 50 provides an operating line characteristic 92. For example, suppose that the capacitor bank 58 provides a capacitance of 100,000 μF (or 0.1 F) and is charged to a voltage of 20 Volts. The slope of the operating line characteristic 92 can be determined as follows:

$$\frac{dE}{dV} = CV. \qquad (2)$$

$$CV = \tan\theta = 2 \qquad (3).$$

$$\theta = 1.107 \text{ radians or } 63.434 \text{ degrees} \qquad (4).$$

The slope and angle θ are extremely useful parameters. For example, from these parameters, one can determine the size of the interval ΔV, i.e., the amount the voltage (V) must be increased from operating in the non-trip region 94 to safely operate in the trip region 92 beyond the indeterminate region 94 (e.g., 1 or 2 Volts). Multiple operating lines may be evaluated for practical packaging and implementation. Further details of the invention will now be provided with reference to FIG. 7.

Figure 7:
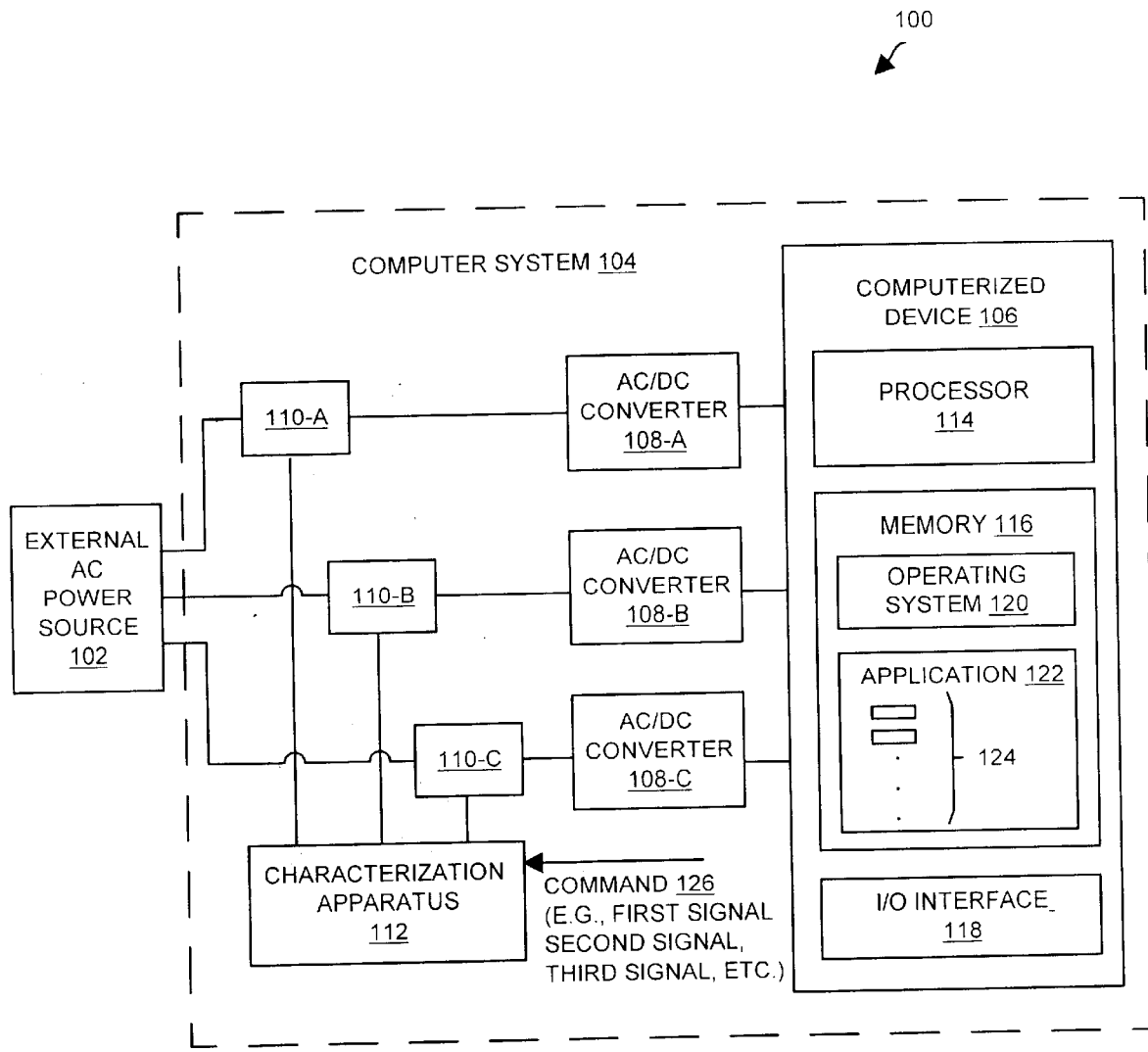
FIG. 7 is a block diagram of an alternative computer system installation that uses software to control a characterization apparatus which is suitable for use by the invention.

FIG. 7 is a block diagram of an alternative computer system installation 100 which is suitable for use by the invention. The installation 100 includes an external AC power source 102 and a computer system 104. The computer system 104 includes a computerized device 106, AC/DC converters 108-A, 108-B and 108-C (collectively, AC/DC converters 108), internal circuit breaker devices 110-A, 110-B and 110-C (collectively, circuit breaker devices 110) and a characterization apparatus 112.

As in the external AC power source 22 of FIG. 2 which includes a multi-poled ganged circuit breaker 42, the external AC power source 102 of FIG. 7 includes a multi-poled ganged circuit breaker having its poles share a common trip linkage such that, when one pole trips, the remaining poles trip as well. Additionally, as in the computer system 24 of FIG. 2 which includes un-ganged internal circuit breakers 30, the internal circuit breaker devices 110 of FIG. 7 are separate, un-ganged devices such that tripping of one circuit breaker device 110 does not automatically cause the remaining circuit breaker devices 110 to trip.

The characterization apparatus 112 is similar to the characterization apparatus 50 of FIG. 3. However, the characterization apparatus 112 includes a controller (e.g., a switch similar to the switch 56 of FIG. 3) that responds to electrical signals (e.g., computerized commands).

By way of example only, the computerized device 106 includes a processor 114, memory 116 and an I/O interface 118. The memory 116 (volatile memory, non-volatile memory, or a combination thereof) stores an operating system 120 and an application 122. The application 122 includes instructions 124 that, when run by the processor 114, cause the computerized device 106 to operate the characterization apparatus 112.

As shown in FIG. 7, the characterization apparatus 112 responds to commands 126 (e.g., digital signals). In particular, when the instructions 124 of the application 122 cause the computerized device 106 to provide a first signal, the characterization apparatus 112 stores energy (e.g., charges a capacitor bank similar to the capacitor bank 58 of FIGS. 3 and 4) from a power source (e.g., an isolated power source similar to the source 62 of FIG. 3). Preferably, the power source is an isolated power source such as the power source 62 of FIG. 3.

When the instructions 124 of the application 122 cause the computerized device 106 to provide a second signal, the characterization apparatus 112 releases energy through one of the circuit breaker devices 110 in order to characterize that circuit breaker device 110 (e.g., discharges the capacitor bank 58 through that circuit breaker device). The particular one of the circuit breaker devices 110 can be selected electronically by the computerized device 106 as well (e.g., using a multiplexor). In response to the released energy, the selected circuit breaker device 110 either trips or does not trip. If the circuit breaker device 110 trips, the circuit breaker device 110 is categorized as operating properly. However, if the circuit breaker device 110 does not trip, the circuit breaker device 110 is categorized as operating improperly and may warrant replacement since it cannot be relied upon to trip before the external circuit breaker of the external AC power source 102 trips.

When the instructions 124 of the application 122 cause the computerized device 106 to provide a third signal, the characterization apparatus 112 disconnects the energy storage device of the characterization apparatus 50 from the power source and the circuit breaker device 110. This situation is useful when servicing the characterization apparatus 112 or other computer system components coupled to the characterization apparatus. In particular, by using the third signal to disconnect the energy storage device, a technician can access or even replace components without disturbing other neighboring components. For example, the technician can replace the energy storage device while the computer system remains online (i.e., powered-up and operational).

It should be understood that the computer system installation 100 provides flexible access to the characterization apparatus 112. In particular, an operator can operate the characterization apparatus 112 locally or remotely. For example, the operator can locally control the operation of the characterization apparatus 112 by operating the I/O interface 118 (e.g., a console or local terminal) of the computerized device 106. The operator can also locally control the characterization apparatus 112 by connecting a portable computerized device (e.g., a laptop computer having an installed application similar to the application 122 for generating the commands 126) directly to the characterization apparatus 112. Additionally, the operator can remotely control the characterization apparatus 112 by remotely connecting to the computerized device 106 through the I/O interface 118 (e.g., through a modem and telephone line, through a network connection or link, etc.). Such remote access allows a technician to characterized the internal circuit breaker devices 110 using the characterization apparatus 50 remotely saving the technician from having to physically visit the computer system installation 100.

Furthermore, the arrangement of FIG. 7 enables characterization of the internal circuit breaker devices 110 in a manual manner or automated manner. For example, the technician can manually use the characterization apparatus 112 to characterize the internal circuit breaker devices 110 by manually interacting with the computerized device 106 (e.g., manually typing in commands to the I/O interface 118). The technician can also automatically use the characterization apparatus 112 by scheduling operation times in the application 122 for using the characterization apparatus 112 (e.g., at convenient times, periodically, etc.).

As described above, the invention is directed to techniques for characterizing a circuit breaker device. Such characterization enables screening and/or testing of circuit breaker devices. For example, a circuit breaker supplier or computer system manufacturer can label circuit breakers into different categories based on their actual thresholds. Manufacturers can then build computer systems with more assurance that an internal circuit breaker will trip rather than an external circuit breaker in response to an over-current fault condition within the computer system. Accordingly, computer systems equipped to continue operating even when a power unit is lost (e.g., fault tolerant computer systems with multiple power units protected by respective internal circuit breaker devices) can avoid catastrophic failures (e.g., a computer system crash). The use of a characterization apparatus such as the ones described above makes characterization of circuit breaker devices repeatable and consistent. The techniques of the invention may be used in computer systems, manufacturing methods, and with other computer-related device such as those manufactured by EMC Corporation of Hopkinton, Mass.

While this invention has been particularly shown and described with references to preferred embodiments thereof, it will be understood by those skilled in the art that various changes in form and details may be made therein without departing from the spirit and scope of the invention as defined by the appended claims.

For example, it should be understood that the above-described characterization apparatus can be integrated within computer systems. However, in alternative arrangements, the characterization apparatus are non-integrated. Rather, they are standalone. Such alternative arrangements are useful when screening circuit breaker devices at a supplier factory or warehouse, or a computer system or component assembly line.

Additionally, it should be understood that the characterization apparatus can be use to characterize circuit breaker devices for circuits other than computer systems. For example, the characterization apparatus can be used to characterize circuit breaker devices for motors, generators, office machines, machine tools, medical devices, instrumentation, robotic equipment, etc. Moreover, the characterization apparatus can be integrated with these other types of machines.

Furthermore, it should be understood that the characterization apparatus was described as being integrated within computer systems with hot swap capabilities (e.g., systems that allow replacement of certain components while the system remains powered-up and in operation). The characterization apparatus can also be integrated into computer systems without such capabilities as well (e.g., computer systems having a single AC/DC converter and a single circuit breaker device).

Additionally, it should be understood that the external AC power source 22 was described as having a line-to-neutral configuration (also known as a "Y" or star configuration, 3-phase/4-wire configuration, etc.) Other wiring arrangements are suitable for use in the external power source 22 as well, e.g., "delta" configurations or line-to-line configurations.

Furthermore, it should be understood that the switch 56 of FIG. 3 can be any combination of a variety of switch types. Such types include those designed for easy handling of high current (e.g., contactor switches, controlled relays, etc.), computer operated switches (e.g., semiconductor switches), and standard three-position, manual switches.

Additionally, it should be understood that the isolated power source 62 that provides energy to the characterization apparatus 50 (see FIG. 3) can have a number of different configurations. Such configurations include a DC power source, an AC power source with an AC/DC converter, a battery, etc.

Furthermore, it should be understood that circuit breaker devices typically have only two states which are mutually exclusive: ON and OFF. Accordingly, some circuit breaker implementations may have only two positions rather than three, where the off position and the trip position are the same position. The invention is suitable for use in characterizing such circuit breaker implementations.

What is claimed is:

1. An apparatus for characterizing a circuit breaker device, comprising:
   an interface that is capable of connecting to the circuit breaker device;
   an energy storage device that is capable of storing and releasing a particular amount of energy; and
   a controller, coupled to the energy storage device and the interface, that (i) disconnects the energy storage device from the interface and connects the energy storage device to an external power source to store the particular amount of energy in the energy storage device, and (ii) disconnects the energy storage device from the external power source and connects the energy storage device to the interface to release, when the circuit breaker device is connected to the interface, energy from the energy storage device through the interface and through the circuit breaker device regardless of whether the circuit breaker device trips, the circuit breaker device being deemed as belonging to a first category when the circuit breaker device trips in response to the released energy, and the circuit breaker device being deemed as belonging to a second category when the circuit breaker device does not trip in response to the released energy.

2. The apparatus of claim 1 wherein the energy storage device is configured to provide direct current through the circuit breaker device when the controller connects the energy storage device to the interface.

3. The apparatus of claim 1 wherein the energy storage device includes a capacitor bank for storing energy from the external power supply and releasing energy through the circuit breaker device.

4. The apparatus of claim 3 wherein the energy storage device further includes a calibration device for adjusting capacitance of the capacitor bank.

5. The apparatus of claim 3 wherein the energy storage device further includes a calibration device for adjusting voltage of the capacitor bank.

6. The apparatus of claim 1 wherein the controller includes a manually operated switch that (i) disconnects the energy storage device from the interface and connects the energy storage device to the external power source when the switch is manually placed in a first position, (ii) disconnects the energy storage device from the external power source and connects the energy storage device to the interface when the switch is manually placed in a second position, and (iii) disconnects the energy storage device from both the interface and the external power source when the switch is manually placed in a third position.

7. The apparatus of claim 1 wherein the controller includes a switch that (i) disconnects the energy storage device from the interface and connects the energy storage device to the external power source in response to a first signal, (ii) disconnects the energy storage device from the external power source and connects the energy storage device to the interface in response to a second signal, and (iii) disconnects the energy storage device from both the interface and the external power source in response to a third signal.

8. A computer system, comprising:
   a computerized device for performing computerized operations;
   a circuit breaker device, coupled to the computerized device, that protects the computerized device against an extreme electrical stress; and
   a characterization apparatus that characterizes the circuit breaker device, the characterization apparatus having:
   an interface that connects to the circuit breaker device,
   an energy storage device that is capable of storing and releasing a particular amount of energy, and
   a controller, coupled to the energy storage device and the interface, that (i) disconnects the energy storage device from the interface and connects the energy storage device to an external power source to store the particular amount of energy in the energy storage device, and (ii) disconnects the energy storage device from the external power source and connects the energy storage device to the interface such that energy is released from the energy storage device through the interface and through the circuit breaker device, the circuit breaker device being deemed as belonging to a first category when the circuit breaker device trips in response to the released energy, and the circuit breaker device being deemed as belonging to a second category when the circuit breaker device does not trip in response to the released energy.

9. The computer system of claim 8 wherein the energy storage device of the characterization apparatus is configured to provide direct current through the circuit breaker device when the controller of the characterization apparatus connects the energy storage device to the interface of the characterization apparatus.

10. The computer system of claim 8 wherein the energy storage device of the characterization apparatus includes a capacitor bank for storing energy from the external power supply and releasing energy through the circuit breaker device.

11. The computer system of claim 10 wherein the energy storage device of the characterization apparatus further includes a calibration device for adjusting capacitance of the capacitor bank.

12. The computer system of claim 10 wherein the energy storage device of the characterization apparatus further includes a calibration device for adjusting voltage of the capacitor bank.

13. The computer system of claim 8 wherein the controller of the characterization apparatus includes a manually operated switch that (i) disconnects the energy storage device from the interface and connects the energy storage device to the external power source when the switch is manually placed in a first position, (ii) disconnects the energy storage device from the external power source and connects the energy storage device to the interface when the switch is manually placed in a second position, and (iii) disconnects the energy storage device from both the interface and the external power source when the switch is manually placed in a third position.

14. The computer system of claim 8 wherein the controller of the characterization apparatus includes a switch that (i) disconnects the energy storage device from the interface and connects the energy storage device to the external power source in response to a first signal, (ii) disconnects the energy storage device from the external power source and connects the energy storage device to the interface in response to a second signal, and (iii) disconnects the energy storage device from both the interface and the external power source in response to a third signal.

15. The computer system of claim 14 wherein each of the first, second and third signals is a command provided to the controller of the characterization apparatus from the computerized device.

16. A method for characterizing a circuit breaker device, comprising:
 setting the circuit breaker device so that the circuit breaker device trips when a particular level of energy is released through the circuit breaker device in a particular amount of time;
 connecting an energy storage device to an external power source to store a particular amount of energy in the energy storage device; and
 disconnecting the energy storage device from the external power source and connecting the energy storage device to the circuit breaker device to release energy from the energy storage device through the circuit breaker device regardless of whether the circuit breaker device trips, the circuit breaker device being deemed as belonging to a first category when the circuit breaker device trips in response to the released energy, and the circuit breaker device being deemed as belonging to a second category when the circuit breaker device does not trip in response to the released energy.

17. The method of claim 16 wherein the step of disconnecting the energy storage device from the external power source and connecting the energy storage device to the circuit breaker device includes the step of:
 providing direct current through the circuit breaker device when the energy storage device connects to the circuit breaker device.

18. The method of claim 16 wherein the energy storage device includes a capacitor bank, and wherein the step of connecting the energy storage device to the external power source includes the step of applying charge to the capacitor bank.

19. The method of claim 18 wherein the energy storage device further includes a calibration device, and wherein the method further comprises the step of:
 adjusting capacitance of the capacitor bank using the calibration device.

20. The method of claim 18 wherein the energy storage device further includes a calibration device, and wherein the method further comprises the step of:
 adjusting voltage of the capacitor bank using the calibration device.

21. The method of claim 16 wherein the step of connecting the energy storage device to the external power source includes the step of manually placing a switch in a first position; and wherein the step of disconnecting the energy storage device from the external power source and connecting the energy storage device to the circuit breaker device includes the step of manually placing the switch in a second position.

22. The method of claim 16 wherein the step of connecting the energy storage device to the external power source includes the step of placing a switch in a first position in response to a first signal, and wherein the step of disconnecting the energy storage device from the external power source and connecting the energy storage device to the circuit breaker device includes the step of placing the switch in a second position in response to a second signal.

23. A computer system, comprising:
 a computerized device for performing computerized operations;
 multiple circuit breaker devices, coupled to the computerized device, that protect the computerized device against extreme electrical stresses; and
 a characterization apparatus that characterizes each of the circuit breaker devices, the characterization apparatus having:
  an interface that connects to the multiple circuit breaker devices,
  an energy storage device, coupled to the interface, that is capable of storing and releasing a particular amount of energy, and
  a controller, coupled to the energy storage device and the interface, that (i) disconnects the energy storage device from the interface and connects the energy storage device to an external power source to store the particular amount of energy in the energy storage device, and (ii) disconnects the energy storage device from the external power source and selectively connects the energy storage device to the multiple circuit breaker devices through the interface such that, when a circuit breaker device is connected to the energy storage device, energy is released from the energy storage device through the interface and through the circuit breaker device, the circuit breaker device being deemed as belonging to a first category when the circuit breaker device trips in response to the released energy, and the circuit breaker device being deemed as belonging to a second category when the circuit breaker device does not trip in response to the released energy.

24. An apparatus for characterizing a circuit breaker device, comprising:
 an interface that is capable of connecting to the circuit breaker device;
 an energy storage device that is capable of storing and releasing a particular amount of energy; and
 control means, coupled to the energy storage device and the interface, for (i) disconnecting the energy storage device from the interface and connecting the energy storage device to an external power source to store the particular amount of energy in the energy storage device, and (ii) disconnecting the energy storage device from the external power source and connecting the energy storage device to the interface to release, when the circuit breaker device is connected to the interface, energy from the energy storage device through the interface and through the circuit breaker device regardless of whether the circuit breaker device trips, the circuit breaker device being deemed as belonging to a first category when the circuit breaker device trips in response to the released energy, and the circuit breaker device being deemed as belonging to a second category when the circuit breaker device does not trip in response to the released energy.

25. A computer system, comprising:
   a computerized device for performing computerized operations;
   a circuit breaker device, coupled to the computerized device, that protects the computerized device against an extreme electrical stress; and
   a characterization apparatus that characterizes the circuit breaker device, the characterization apparatus having:
   an interface that connects to the circuit breaker device,
   an energy storage device that is capable of storing and releasing a particular amount of energy, and
   control means, coupled to the energy storage device and the interface, for (i) disconnecting the energy storage device from the interface and connecting the energy storage device to an external power source to store the particular amount of energy in the energy storage device, and (ii) disconnecting the energy storage device from the external power source and connecting the energy storage device to the interface such that energy is released from the energy storage device through the interface and through the circuit breaker device, the circuit breaker device being deemed as belonging to a first category when the circuit breaker device trips in response to the released energy, and the circuit breaker device being deemed as belonging to a second category when the circuit breaker device does not trip in response to the released energy.

26. A computer program product that includes a computer readable medium having instructions stored thereon for characterizing a circuit breaker device, such that the instructions, when processed by a computerized device, cause the computerized device to:
   set the circuit breaker device so that the circuit breaker device trips when a particular level of energy is released through the circuit breaker device in a particular amount of time;
   connect an energy storage device to an external power source to store a particular amount of energy in the energy storage device; and
   disconnect the energy storage device from the external power source and connect the energy storage device to the circuit breaker device such that energy is released from the energy storage device through the circuit breaker device, the circuit breaker device being deemed as belonging to a first category when the circuit breaker device trips in response to the released energy, and the circuit breaker device being deemed as belonging to a second category when the circuit breaker device does not trip in response to the released energy.

27. The apparatus of claim 1 wherein the energy storage device has an energy storage capacity that exceeds a predetermined trip threshold by a predetermined tolerance in order to discharge, as the energy released through the interface and through the circuit breaker device, an amount of energy in excess of the predetermined trip threshold to trip the circuit breaker device when the circuit breaker device has a trip threshold that is less than or equal to the predetermined trip threshold, and to not trip the circuit breaker device when the circuit breaker has a trip threshold that is greater than the predetermined trip threshold.

28. The apparatus of claim 27 wherein the interface is configured to electrically connect to electrical protection contacts of the circuit breaker device to pass current through the electrical protection contacts of the circuit breaker device regardless of whether the circuit breaker device trips.

29. The computer system of claim 8 wherein the energy storage device has an energy storage capacity that exceeds a predetermined trip threshold by a predetermined tolerance in order to discharge, as the energy released through the interface and through the circuit breaker device, an amount of energy in excess of the predetermined trip threshold to trip the circuit breaker device when the circuit breaker device has a trip threshold that is less than or equal to the predetermined trip threshold, and to not trip the circuit breaker device when the circuit breaker has a trip threshold that is greater than the predetermined trip threshold.

30. The method of claim 16 wherein the step of connecting the energy storage device to the external power source includes the step of:
   storing, in the energy storage device, an amount of energy that exceeds a predetermined trip threshold by a predetermined tolerance in order to discharge, as the energy released through the interface and through the circuit breaker device, an amount of energy in excess of the predetermined trip threshold to trip the circuit breaker device when the circuit breaker device has a trip threshold that is less than or equal to the predetermined trip threshold, and to not trip the circuit breaker device when the circuit breaker has a trip threshold that is greater than the predetermined trip threshold.

31. An apparatus for characterizing a circuit breaker device, the apparatus comprising:
   an interface that is capable of connecting to the circuit breaker device;
   an energy storage device that is capable of storing and releasing a particular amount of energy; and
   a controller coupled to the energy storage device and the interface, the controller, when the circuit breaker device is connected to the interface, being configure to selectively:
   (i) disconnect the energy storage device from the interface and connect the energy storage device to a power source to store the particular amount of energy in the energy storage device, and
   (ii) disconnect the energy storage device from the power source and connect the energy storage device to the interface to release the particular amount of energy through the interface and through the circuit breaker device regardless of whether the circuit breaker trips, the circuit breaker device being deemed to belong to a first category when the circuit breaker device trips in response to the released energy, and the circuit breaker device being deemed to belong to a second category when the circuit breaker device does not trip in response to the released energy.

32. The apparatus of claim 31 wherein the energy storage device has an energy storage capacity that exceeds a predetermined trip threshold by a predetermined tolerance in order to discharge, as the energy released through the interface and through the circuit breaker device, an amount of energy in excess of the predetermined trip threshold to trip the circuit breaker device when the circuit breaker device has a trip threshold that is less than or equal to the predetermined trip threshold, and to not trip the circuit breaker device when the circuit breaker has a trip threshold that is greater than the predetermined trip threshold.

33. The apparatus of claim 31 wherein the energy storage device has an energy storage capacity that exceeds a predetermined trip threshold by a predetermined tolerance to trip circuit breaker devices having trip thresholds substantially equal to the predetermined trip threshold, and to not trip circuit breaker devices having trip thresholds which are substantially higher than the predetermined trip threshold.

34. The apparatus of claim 33 wherein circuit breaker devices that trip in response to the released energy are deemed to be within specification, and circuit breaker devices that do not trip in response to the release energy are deemed to be outside of specification.

* * * * *